(12) United States Patent
Clyburn (10) Patent No.: US 9,448,268 B2
(45) Date of Patent: Sep. 20, 2016

(54) INDUCTIVE SENSOR ACTUATOR WITH RECIPROCATING CONTACT POST

(71) Applicant: Balluff, Inc., Florence, KY (US)

(72) Inventor: C. Wayne Clyburn, Union, KY (US)

(73) Assignee: Balluff, Inc., Florence, KY (US)

( * ) Notice: Subject to any disclaimer, the term of this patent is extended or adjusted under 35 U.S.C. 154(b) by 767 days.

(21) Appl. No.: 13/763,825

(22) Filed: Feb. 11, 2013

(65) Prior Publication Data
US 2013/0207672 A1    Aug. 15, 2013

Related U.S. Application Data (60) Provisional application No. 61/597,880, filed on Feb. 13, 2012.

(51) Int. Cl.
G01R 27/28 (2006.01)
G01R 27/26 (2006.01)
H03K 17/97 (2006.01)

(52) U.S. Cl.
CPC ............ *G01R 27/2611* (2013.01); *H03K 17/97* (2013.01); *H03K 2017/9706* (2013.01)

(58) Field of Classification Search
CPC .......... G01R 1/06794; G01R 31/2851; H01R 43/0207; G01N 35/1072; H04N 5/33; H04N 7/185; H01L 21/02024
USPC .......... 324/600, 654, 691, 160, 179, 207.23, 324/631, 167, 86, 323, 339, 362, 200, 324/207.15, 76.75, 76.11
See application file for complete search history.

(56) References Cited

U.S. PATENT DOCUMENTS

| | | | |
|---|---|---|---|
| 2003/0218812 A1* | 11/2003 | Foote ..................... | B60R 1/078 359/874 |
| 2005/0285538 A1* | 12/2005 | Jaworski ................... | A61L 9/03 315/76 |
| 2012/0283563 A1* | 11/2012 | Moore ............... | A61B 10/0275 600/437 |
| 2014/0163664 A1* | 6/2014 | Goldsmith ....... | A61B 17/00491 623/1.11 |

FOREIGN PATENT DOCUMENTS

JP        2884400        4/1999

OTHER PUBLICATIONS

Canadian Office Action dated May 30, 2014 for U.S. Pat. No. 2,805,538.

* cited by examiner

*Primary Examiner* — Vincent Q Nguyen
*Assistant Examiner* — Trung Nguyen
(74) *Attorney, Agent, or Firm* — Frost Brown Todd LLC (57) ABSTRACT

A sensor assembly comprises a housing, a bushing, a contact post, and a sensor. The housing has a hollow interior and the bushing is disposed within the hollow interior of the housing at a distal end of the housing. The bushing has a hollow interior, and the contact post is configured to slide within the hollow interior of the bushing as a tip of the contact post comes into contact with a surface. The contact post has a partial bore and the sensor is configured to slide into the partial bore if necessary. The sensor is also configured to measure a distance between the bottom of the contact post and a tip of the sensor. The sensor may communicate the measurement to a data processor.

20 Claims, 13 Drawing Sheets

INDUCTIVE SENSOR ACTUATOR WITH RECIPROCATING CONTACT POST

PRIORITY

This application claims priority to U.S. Provisional Patent Application Ser. No. 61/597,880, filed Feb. 13, 2012, entitled "Inductive Sensor Actuator with Reciprocating Contact Post," the disclosure of which is incorporated by reference herein.

BACKGROUND

Sensors may be used for a variety of purposes in a variety of manufacturing processes. Examples of such sensors include proximity sensors. Proximity sensors may be provided in a variety forms, including capacitive, inductive, photoelectric, magnetic, etc. Some such sensors are used to detect the presence of items, the configuration of items, and/or other properties of items as the items travel along a line in a manufacturing process. In some instances, at least part of the sensor comes into contact with the items as the items pass by the sensor. Such repeated contact may eventually wear on the sensor, affecting the length of the working life of the sensor. While a variety of sensors have been made and used, it is believed that no one prior to the inventor(s) has made or used an invention as described herein.

BRIEF DESCRIPTION OF THE DRAWINGS

It is believed the present invention will be better understood from the following description of certain examples taken in conjunction with the accompanying drawings, in which like reference numerals identify the same elements and in which.

The drawings are not intended to be limiting in any way, and it is contemplated that various embodiments of the invention may be carried out in a variety of other ways, including those not necessarily depicted in the drawings. The accompanying drawings incorporated in and forming a part of the specification illustrate several aspects of the present invention, and together with the description serve to explain the principles of the invention; it being understood, however, that this invention is not limited to the precise arrangements shown.

DETAILED DESCRIPTION

The following description of certain examples of the invention should not be used to limit the scope of the present invention. Other examples, features, aspects, embodiments, and advantages of the invention will become apparent to those skilled in the art from the following description, which is by way of illustration, one of the best modes contemplated for carrying out the invention. As will be realized, the invention is capable of other different and obvious aspects, all without departing from the invention. Accordingly, the drawings and descriptions should be regarded as illustrative in nature and not restrictive.

FIGS. 1-5 illustrate an exemplary sensor assembly (10). Sensor assembly (10) of this example comprises a housing (20), a contact post (30), and a proximity sensor (40). As will be described in greater detail below, contact post (30) is configured to reciprocate relative to housing (20), to activate proximity sensor (40) when an object sufficiently bears against the tip (32) of contact post (30). By way of example only, sensor assembly (10) may be used to monitor sheet metal (e.g., the hood of an automobile, etc.) passing along a manufacturing line (e.g., in a transfer die stamping press, etc.). In some examples, if the sheet metal is not configured properly (e.g., a certain bend exists where there should be no bend, a manufactured opening is missing where a manufactured opening should be present, etc.), proximity sensor (40) is tripped and appropriate action is taken. As another merely illustrative example, appropriately configured sheet metal may trigger sensor assembly (10), such that appropriate action is taken when the sheet metal fails to trigger sensor assembly (10). As yet another merely illustrative example, a piece of sheet metal may trigger sensor assembly (10) when it has completed one manufacturing stage and is transitioning to another manufacturing stage, such that triggering sensor assembly (10) indicates the completion of a stage for that item. Similarly, sensor assembly (10) may be used to detect when an object is fully seated in an assembly fixture (e.g., a robotic welding fixture, etc.), such that activation of sensor assembly (10) will trigger or at least enable/unlock an operation (e.g., welding, etc.) on the object at the fixture. As still another example, sensor assembly (10) may be used to determine whether a manufactured object is within a prescribed manufacturing tolerance. Various other suitable ways in which sensor assembly (10) may be used will be apparent to those of ordinary skill in the art in view of the teachings herein.

Figure 1:
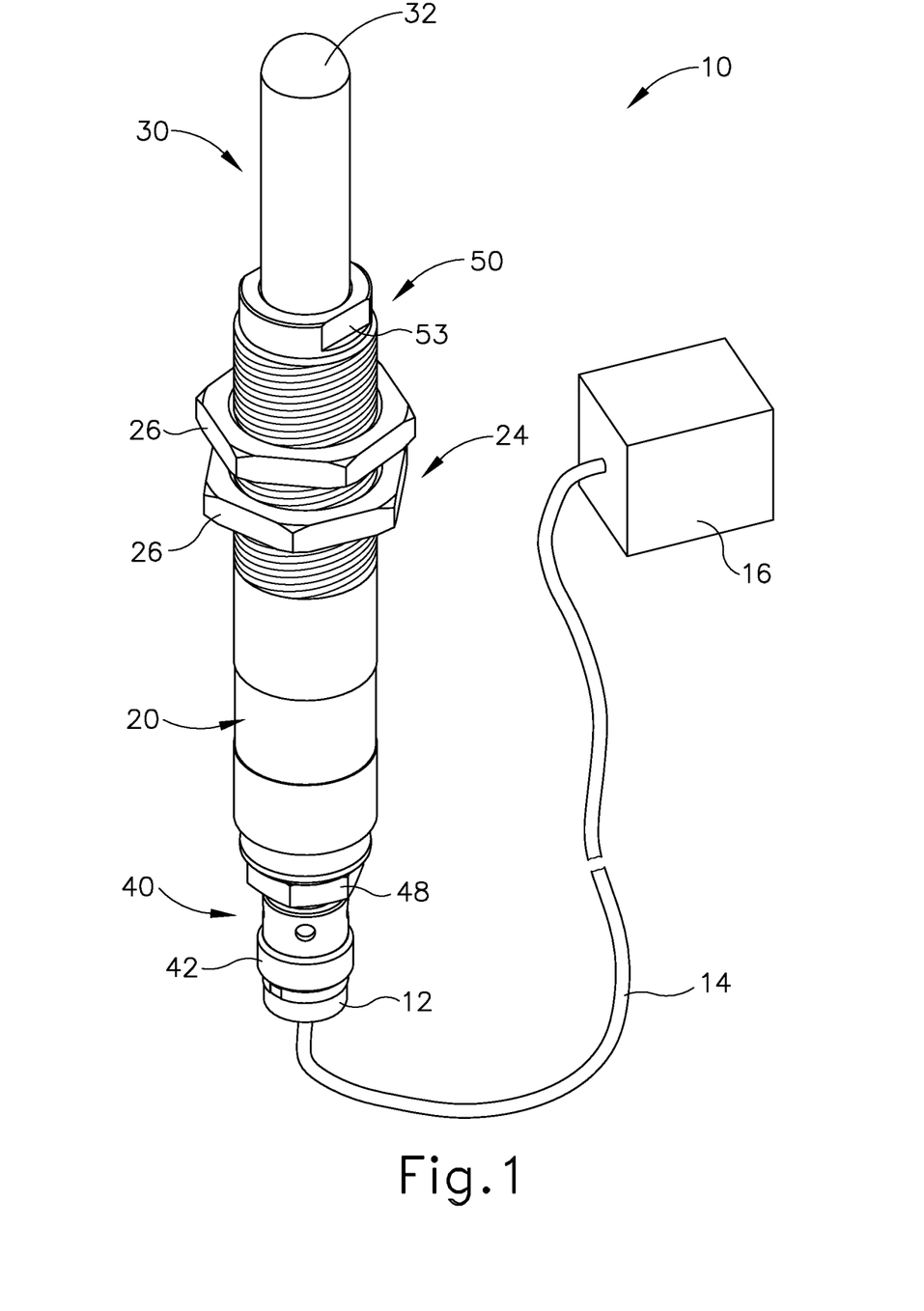
FIG. 1 depicts a perspective view of an exemplary sensor assembly.
Figure 2:
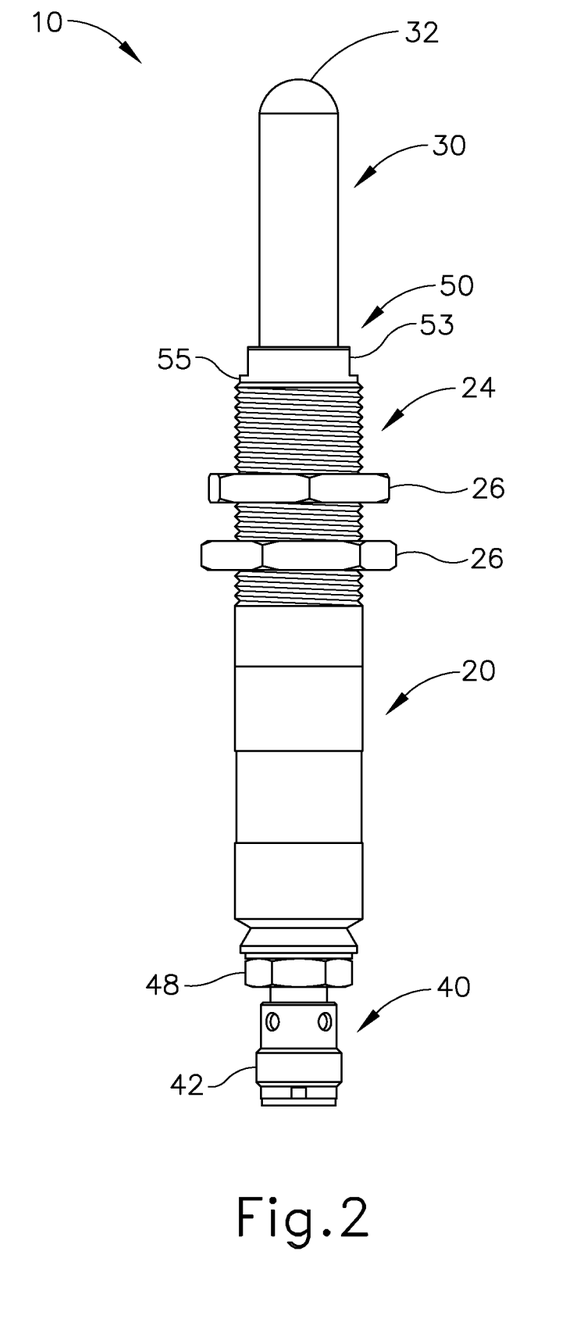
FIG. 2 depicts an elevational view of the sensor assembly of FIG. 1.

FIG. 1 shows a connector (42) of proximity sensor (40) coupled with a complementary connector (12) of a cable (14), which is further coupled with a module (16). It should be understood that connectors (12, 42) may have any suitable construction, including any suitable conventional electrical connector construction. Similarly, cable (14) may have any suitable construction, including any suitable conventional cable construction. Module (16) may also take a variety of forms (e.g., a manufacturing process controller or control system, a personal computer, etc.); and may process data from sensor assembly (10) in a variety of ways. For instance, module (16) may trigger a downstream operation in a production process (e.g., initiate a robotic welder to perform a welding operation, activate a press or stamping machine, etc.), in response to data from sensor assembly (10); may trigger an alert in response to data from sensor assembly (10); may log information in response to data from sensor assembly (10); and/or operate in any other suitable fashion. It should also be understood that several sensor assemblies (10) and/or other devices may be in communication with module (16), such that module (16) need not necessarily be exclusively associated with a single sensor assembly (10). Various suitable forms that module (16) may take, as well as various operations that may be performed by module (16) in response to data from sensor assembly (10) and/or other inputs, will be apparent to those of ordinary skill in the art in view of the teachings herein. It should also be understood that a variety of components may be interposed between sensor assembly (10) and module (16), including but not limited to an amplifier, etc. Furthermore, it should be understood that cable (14) and/or module (16) may be omitted in some versions. As yet another merely illustrative example, module (16) may be integrated into sensor (40) and/or sensor assembly (10).

Figure 3:
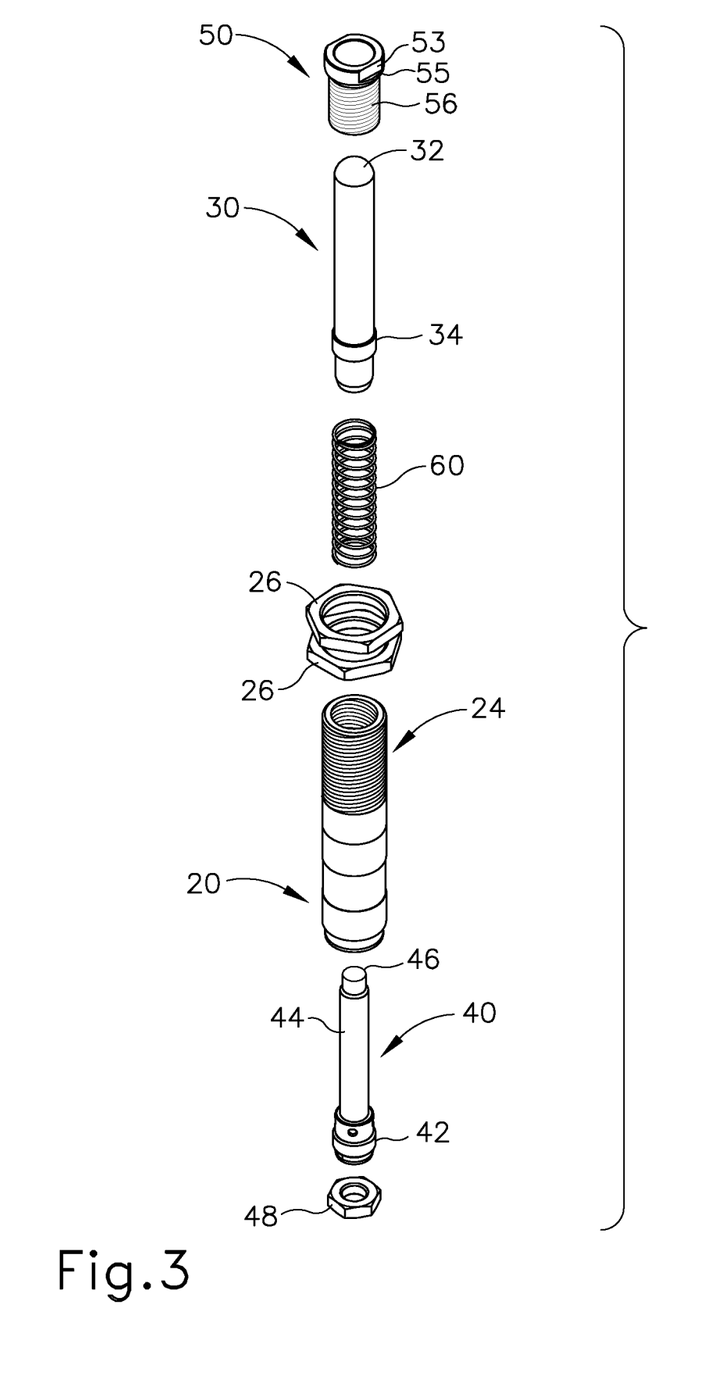
FIG. 3 depicts an exploded perspective view of the sensor assembly of FIG. 1.
Figure 4:
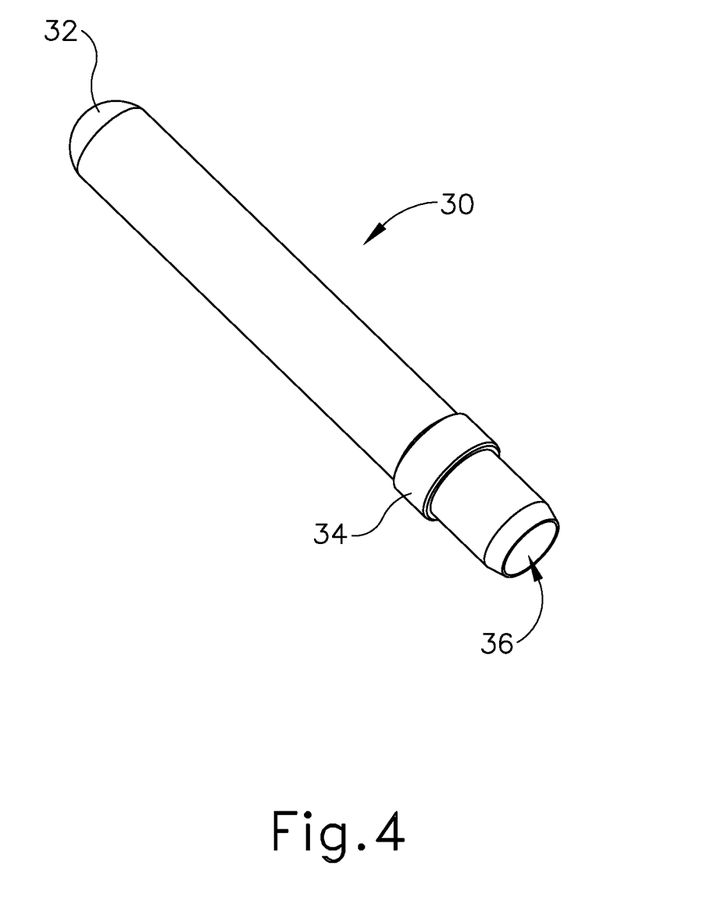
FIG. 4 depicts a perspective view of a contact post of the sensor assembly of FIG. 1.
Figure 5A:
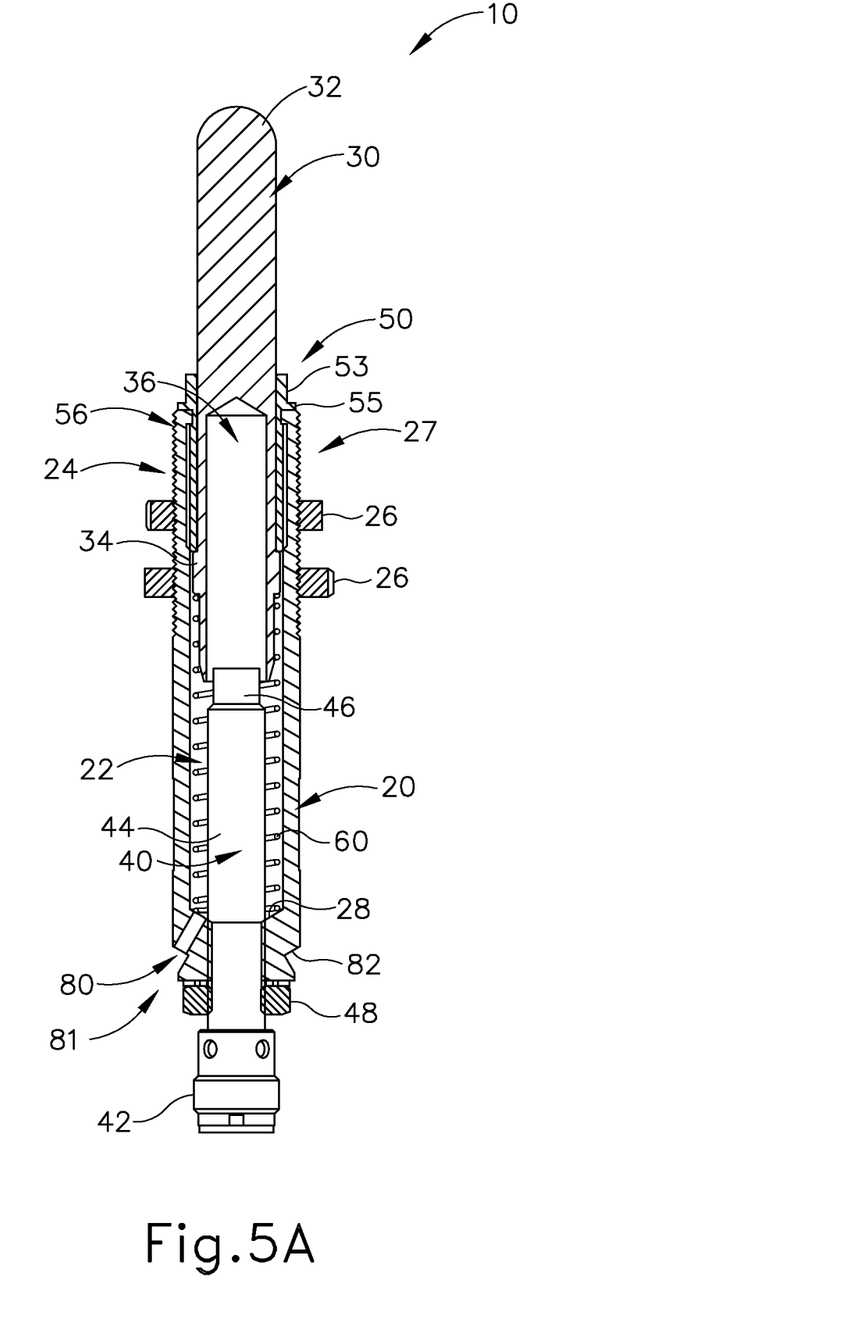
FIG. 5A depicts a cross-sectional view of the sensor assembly of FIG. 1, with the contact post in an extended position.
Figure 5B:
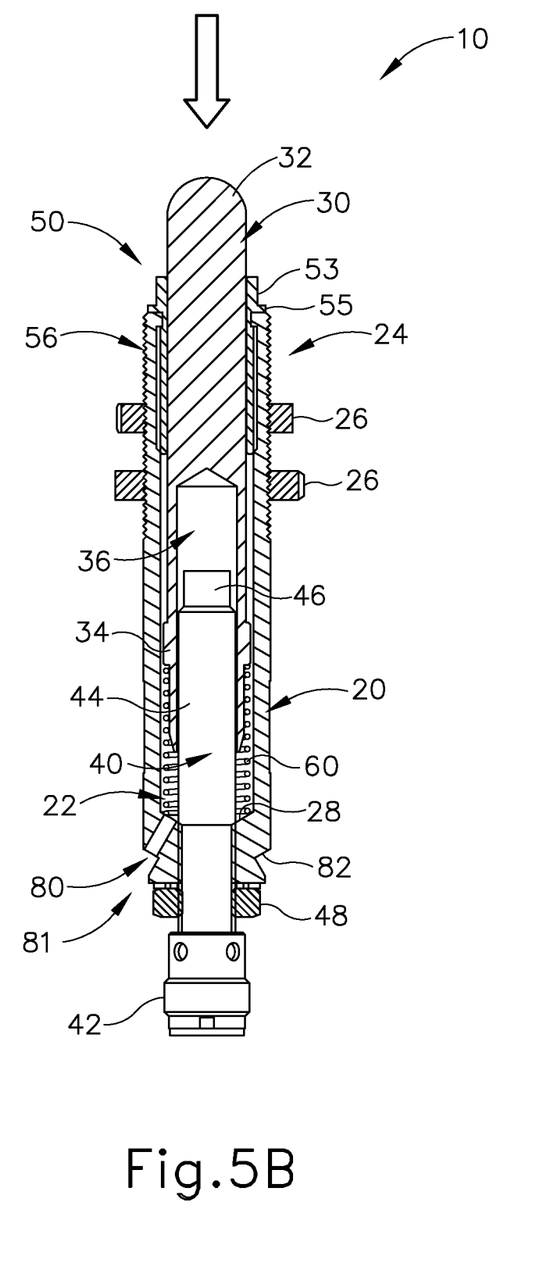
FIG. 5B depicts a cross-sectional view of the sensor assembly of FIG. 1, with the contact post in a retracted position.

Housing (20) of the present example comprises a metal (e.g., steel, etc.) tube defining a bore (22) and presenting exterior threading (24). A pair of nuts (26) are threadably disposed on threading (24). It should be understood that nuts (26) may be used to adjustably secure and position housing (20) relative to a fixture (e.g., between stages along manufacturing process line, within a stage of a manufacturing process, etc.). It should also be understood that threading (24) and nuts (26) are merely optional, and that housing (20) may be secured and adjusted in any other suitable fashion. As best seen in FIGS. 3 and 5, a proximal portion of contact post (30) and a distal portion of proximity sensor (40) are positioned within bore (22) of housing (20). In addition, a bronze bushing (50) and a coil spring (60) are disposed within bore (22) of housing (20). Of course, any other suitable material may be used to form bushing (50), such that bronze is not required. In the present example, bore (22) of housing (20) presents interior threading (27). Bushing (50) comprises a shoulder (55) and a threaded region (56). Bushing (50) threads into bore (22) of housing (20) until shoulder (55) of bushing (50) contacts housing (20) as shown in FIGS. 5A-5B. Bushing (50) further comprises a plurality of flat surfaces (53) on an exterior surface of bushing (50). Flat surfaces (53) may be utilized to tighten bushing (50) within bore (22) of housing (20).

Figure 6:
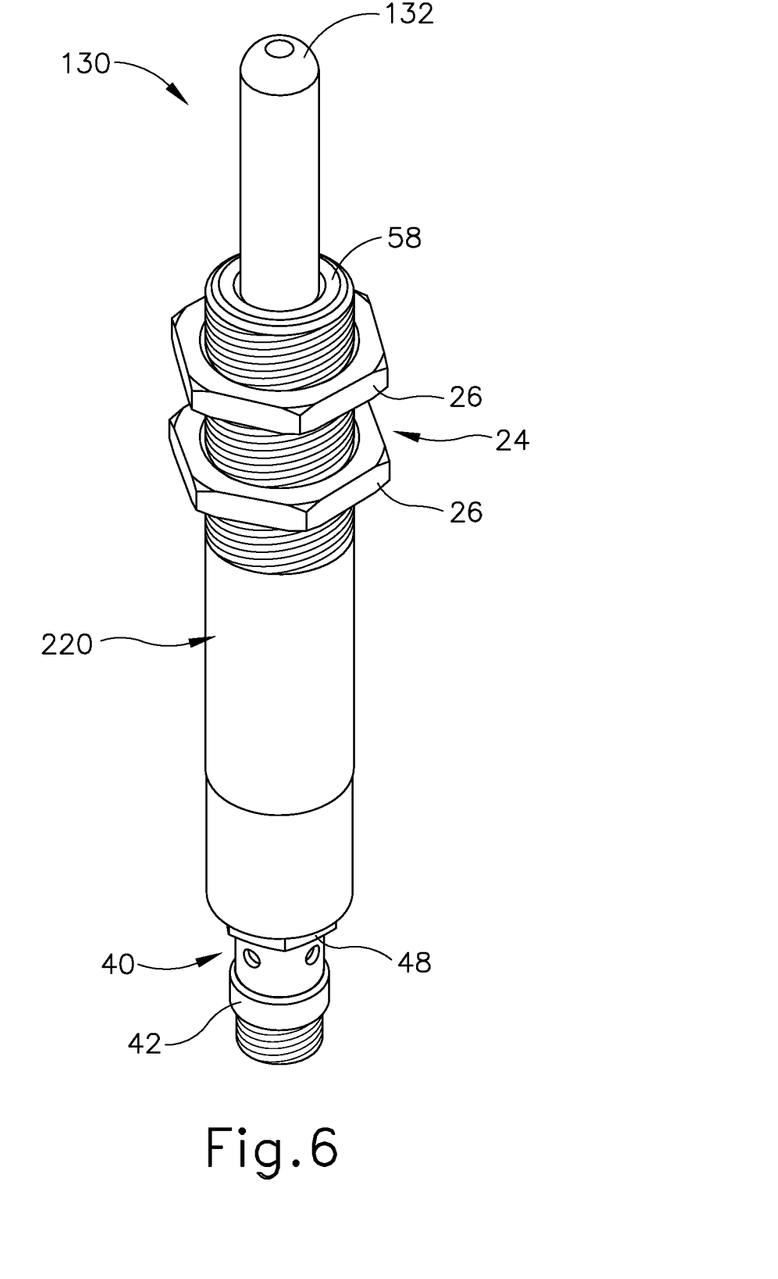
FIG. 6 depicts a perspective view of the sensor assembly of FIG. 1 having an exemplary alternative contact post and an exemplary alternative bushing.

An exemplary alternative bushing configuration is shown in FIG. 6. A bushing (58) is press-fit into a bore (not shown) of an alternative housing (220), such that bushing (58) is secured within housing (220) through interference. In some versions, the bore may include a shoulder that restricts the depth to which bushing (58) may be inserted in the bore of housing (220).

Returning back to FIG. 5, housing (20) includes an interior shoulder (28) at the bottom end or proximal end of bore (22), to thereby mechanically ground coil spring (60). In other words, the bottom or proximal end of coil spring (60) bears against interior shoulder (28). It should be understood, that the spring rate of spring (60) may vary, such that a particular spring may be selected to proved a desired bias to contact post (30). In the present example, housing (20) also includes a recess (81) and a weep hole (80) configured to provide fluid communication between bore (22) of housing (20) and the exterior of housing (20). As shown in FIGS. 5A-5B, recess (81) is located on the exterior of housing (20) at a position proximal to interior shoulder (28). Recess (81) presents an exterior shoulder (82). Weep hole (80) is oriented such that an interior opening is located on interior shoulder (28) and an exterior opening is located on exterior shoulder (82). Among other functions, weep hole (80) may provide for drainage of fluids within bore (22) of housing (20) and/or allow for the introduction and/or removal of compressed gases or fluids within bore (22) of housing (20). Still other suitable features and configurations for housing (20) will be apparent to those of ordinary skill in the art in view of the teachings herein.

Figure 7:
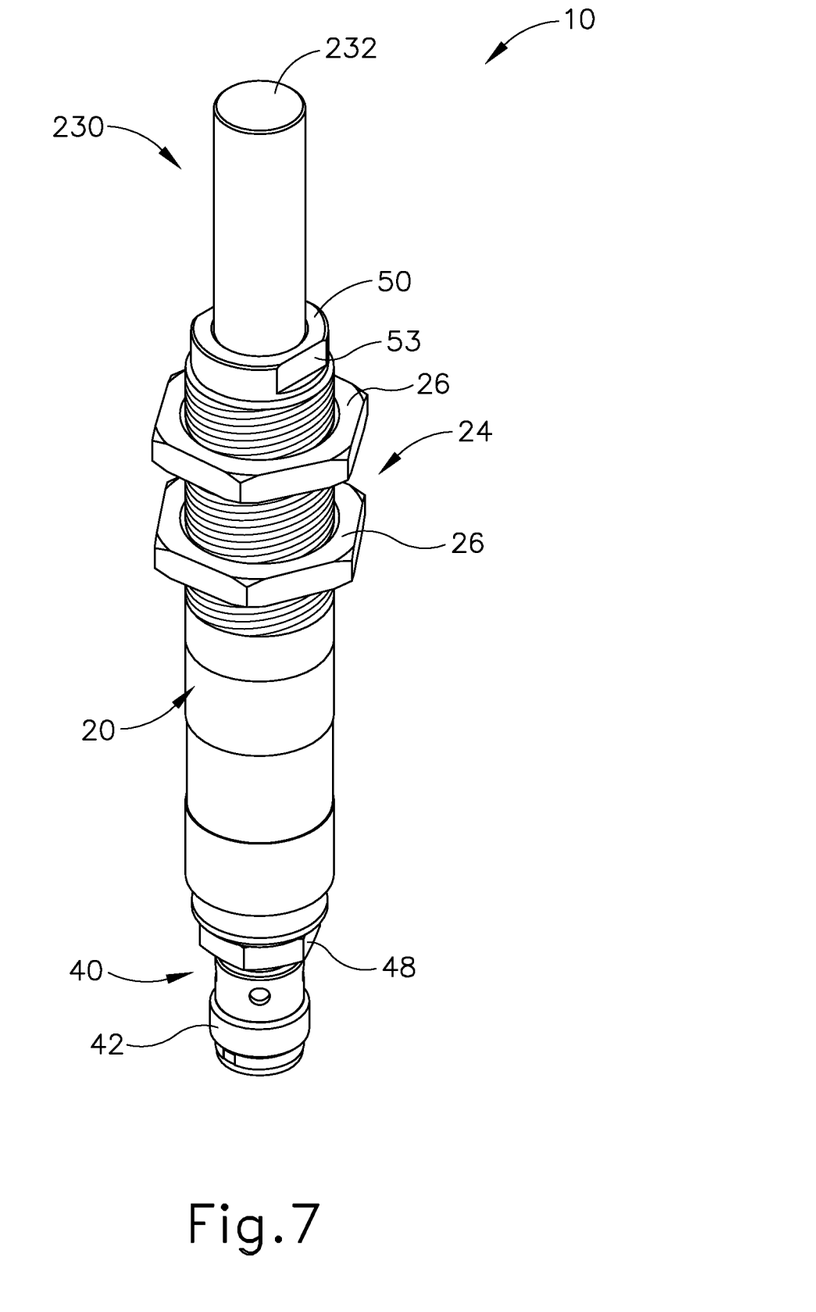
FIG. 7 depicts a perspective view of the sensor assembly of FIG. 1 having another exemplary alternative contact post.
Figure 8:
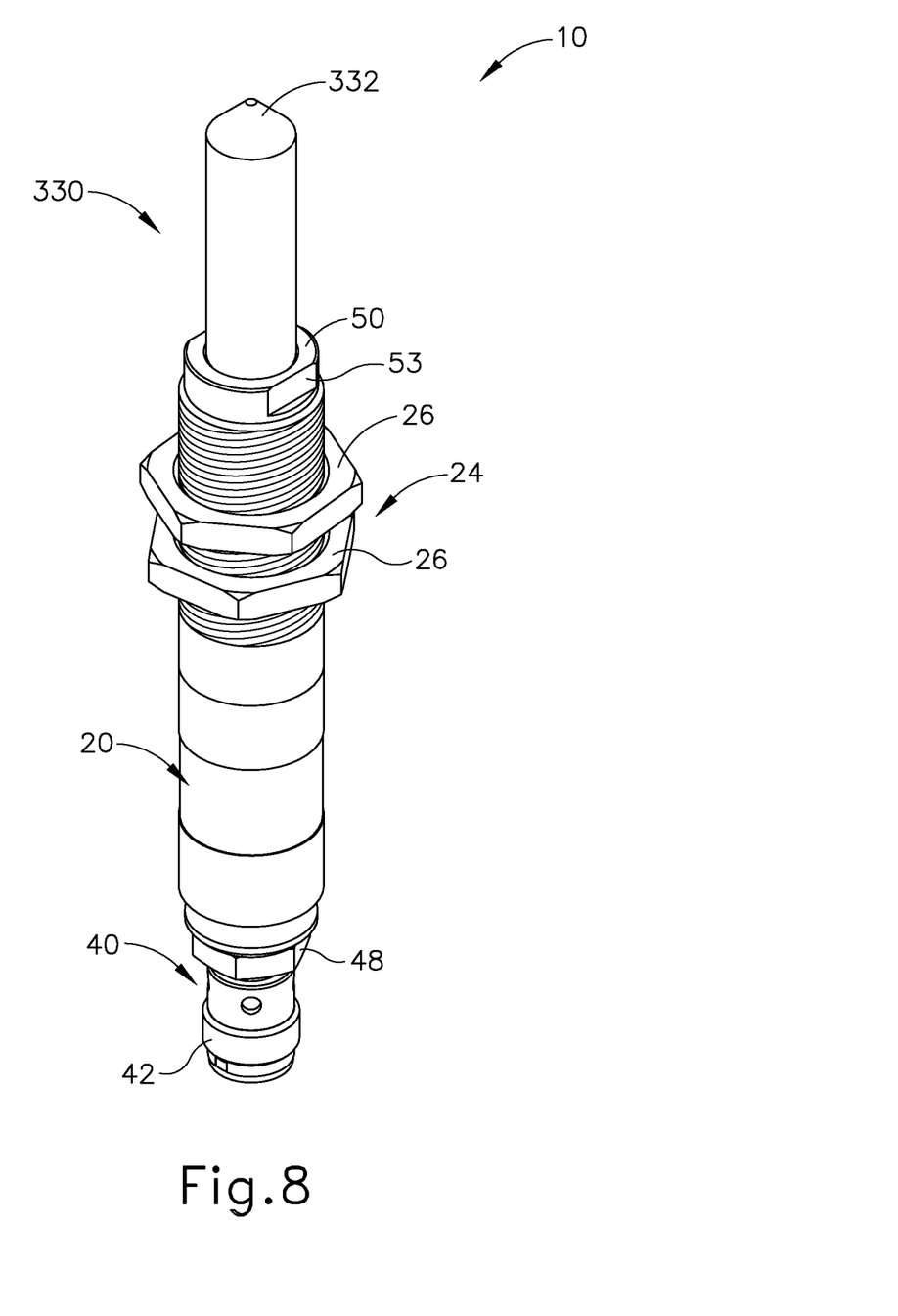
FIG. 8 depicts a perspective view of the sensor assembly of FIG. 1 having another exemplary alternative contact post.
Figure 9:
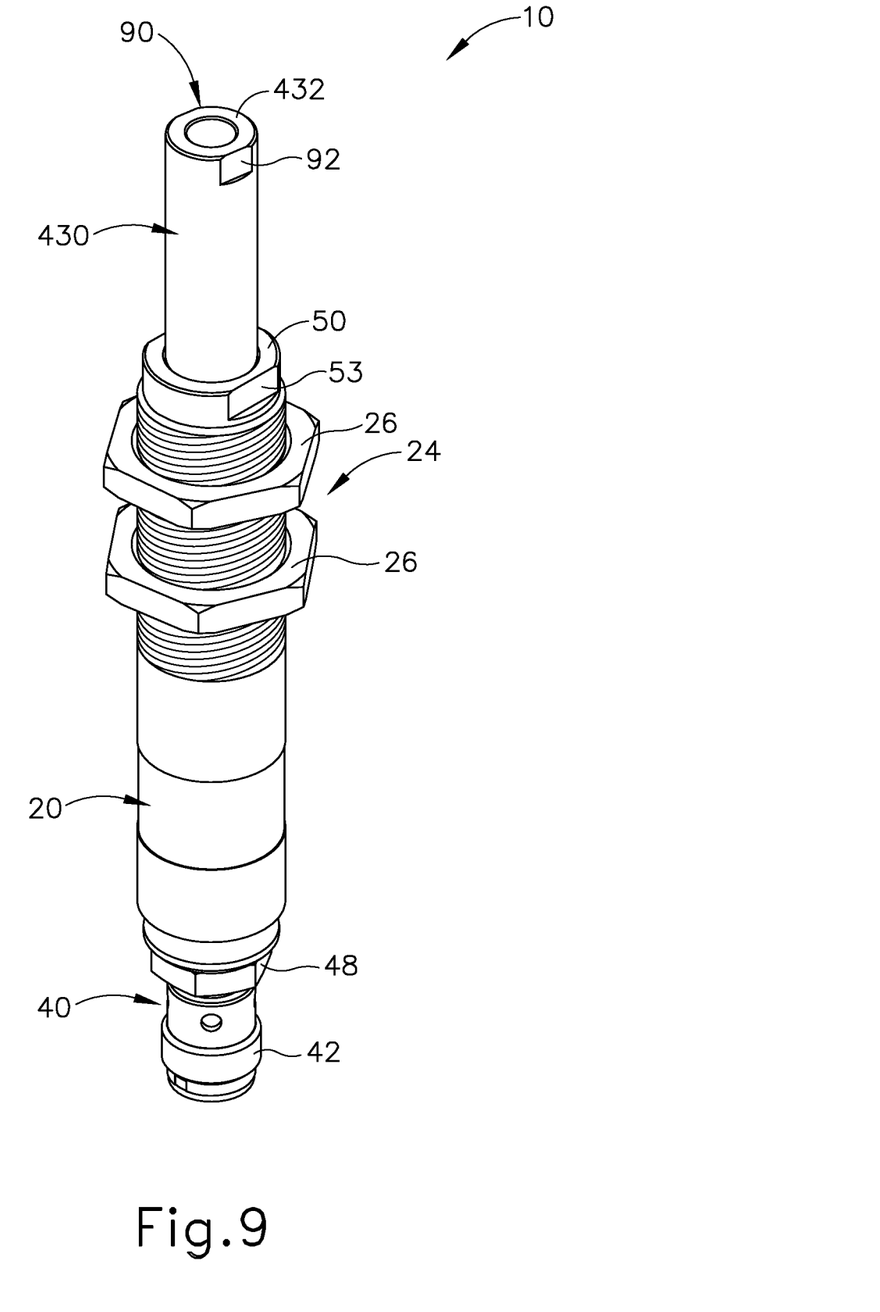
FIG. 9 depicts a perspective view of the sensor assembly of FIG. 1 having another exemplary alternative contact post.
Figure 10:
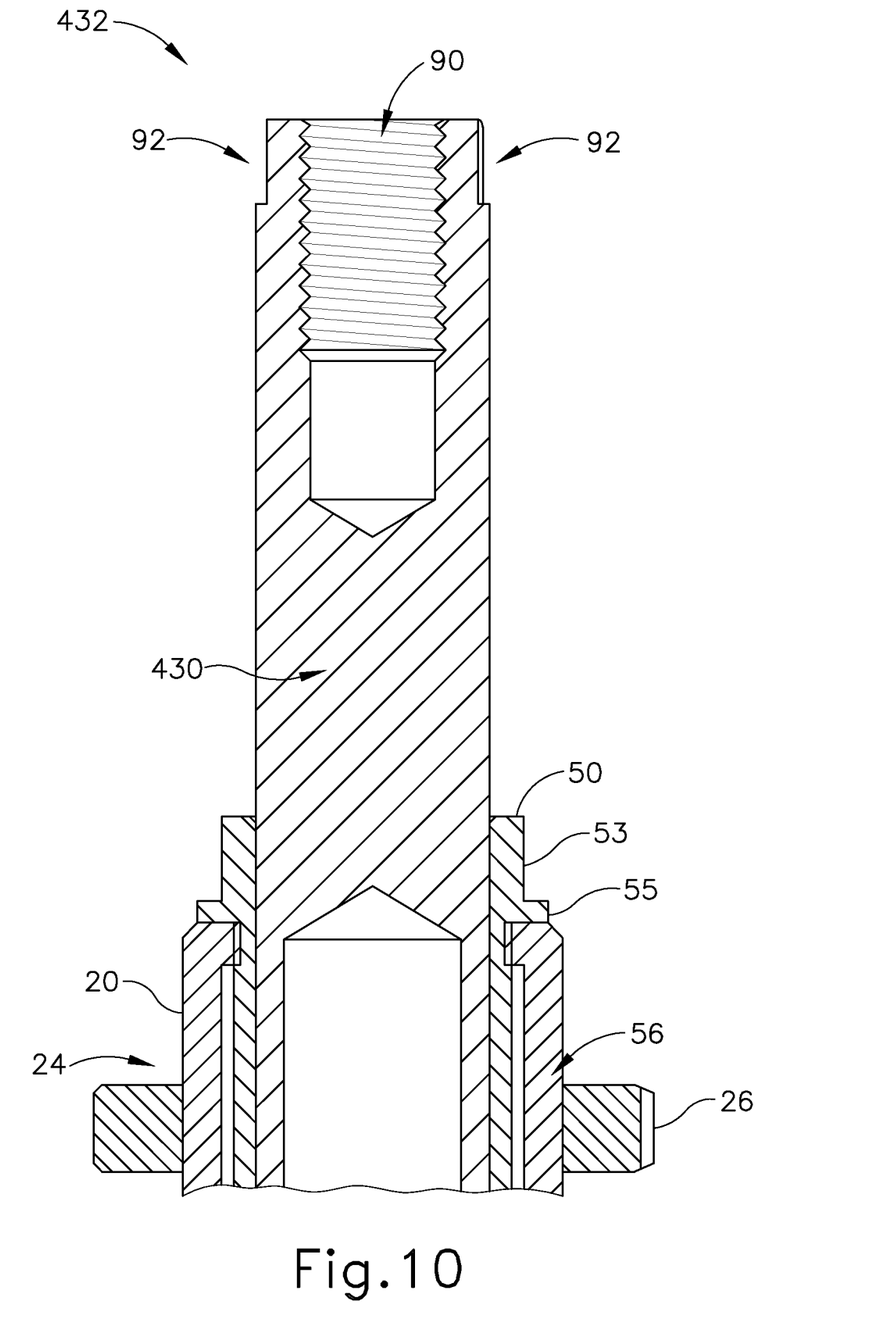
FIG. 10 depicts a detailed cross-sectional view of the sensor assembly of FIG. 1 having the alternative contact post of FIG. 9.

Contact post (30) of the present example includes a tip (32), an annular shoulder (34), and a partial bore (36). Tip (32) is generally rounded with a hemispherical profile in the present example, though it should be understood that tip (32) may have any suitable configuration. For example, FIG. 6 shows an exemplary contact post (130) having a tip (132) with a bullnose configuration, with a generally flat distal face having a rounded edge. As another example, FIG. 7 shows an exemplary contact post (230) having a tip (232) that is substantially flat. As yet another example, FIG. 8 shows an exemplary contact post (330) having a tip (332) that is generally conical in shape and coming to a point. Finally, as yet another example, FIGS. 9-10 show an exemplary contact post (430) having a tip (432) that is substantially flat while further comprising a threaded bore (90) and flat surfaces (92). As best seen in FIG. 10, threaded bore (90) is disposed within contact post (30). Among other functions, threaded bore (90) would allow a user to utilize a custom tip (not shown) by threading the custom tip into threaded bore (90). Flat surfaces (92) may be grasped with a wrench, among other tools, in order to prevent rotation of contact post (30) while tightening and/or loosening the custom tip from contact post (30).

As noted above, contact post (30) is configured to fit within bore (22) and reciprocate relative to housing (20). To that end, contact post (30) is slidably disposed within bushing (50). While the fit between contact post (30) and bushing (50) permits contact post (30) to slide relative to bushing (50), the fit is also configured to prevent debris from entering bore (22). As best seen in FIG. 5, shoulder (34) of contact post (30) is positioned below or proximal to bushing (50). Thus, engagement between shoulder (34) and bushing (50) restricts upward or distal movement of contact post (30) relative to housing (20). In addition, the upper or distal end of coil spring (60) bears against the bottom or proximal face of shoulder (34), providing an upward or distal bias to contact post (30). In other words, coil spring (60) biases contact post (30) to the extended position shown in FIG. 5A; but is compressible to enable contact post (30) to reach a retracted position such as the position shown in FIG. 5B.

Proximity sensor (40) of the present example comprises a connector (42), as noted above, as well as a body (44) and an inductive head (46). Head (46) is unshielded in the present example, such that head (46) generates a magnetic field that extends through a range extending longitudinally above head (46) and radially outwardly from head (46). Head (46) is thus configured to generate a signal in response to a metallic object moving into this field or certain spatial range relative to head (46). In other words, head (46) of the present example is sensitive to the proximity of a metallic object moving in a longitudinal direction toward head (46);

as well as a metallic object moving within a certain radial range relative to the longitudinal axis defined by sensor (40). Signals generated by head (46) are communicated through connector (42). By way of example only, proximity sensor (40) may comprise a conventional GLOBALPROX unshielded proximity sensor by Balluff, Inc. of Florence, Ky. Alternatively, any other suitable type of proximity sensor (40) may be used, including but not limited to non-inductive sensors.

Proximity sensor (40) is disposed within bore (22) and is secured to housing (20) by a nut (48). Thus, proximity sensor (40) and housing (20) are both fixedly secured relative to a fixture when sensor assembly (10) is installed. As best seen in FIG. 5, head (46) of sensor (40) is positioned below or proximal to bore (36) of post (30). Thus, when post (30) is actuated to a retracted position (e.g., as shown in FIG. 5B), head (46) is positioned within bore (36). The proximity of the wall defining bore (36) thus triggers proximity sensor (40). In other words, proximity sensor (40) is triggered when post (30) is retracted far enough to position head (46) in bore (36), or at least when the lower edge and sidewall of post (30) that defines bore (36) is radially adjacent to head (46). It should also be understood that the length of bore (36) may permit additional retraction of post (30) within housing (20), even after proximity sensor (40) has been triggered, without post (30) coming into contact with any part of proximity sensor (40). Proximity sensor (40) remains in a triggered/active state as post (30) continues to retract into housing (20). Head (46) may thus remain fully protected within housing (20) and even within bore (36) during normal use of sensor assembly (10). In other words, in some versions no component of post (30) or any other component of sensor assembly (10) ever comes into contact with head (46), such that mechanical wear or damage to head (46) is prevented.

In the present example, bore (36) does not extend the full length of post (30). It should be understood that bore (36) may extend any suitable length within post (30). It should also be understood that repeated contact of items against tip (32) of post (30) may eventually wear away at tip (32). Such wear may eventually result in tip (32) being positioned too far from the intended path of objects moving through the manufacturing process. When this occurs, the position of sensor assembly (10) may be readily adjusted simply by adjusting the positioning of nuts (26) along threading (24). It should also be understood that making a significant length of post (30) solid (e.g., by not extending bore (36) to an excessive length) may result in post (30) tolerating a significant amount of wear without needing to be replaced.

It should be understood that the longitudinal position of proximity sensor (40) relative to housing (20) may be adjusted to selectively adjust the sensitivity of sensor assembly (10). For instance, the positioning may be adjusted via nut (48), via some other type of threaded coupling, or otherwise. By adjusting the longitudinal position of proximity sensor (40) relative to housing (20), this will result in adjustment of the distance between head (46) and the lower or proximal end of post (30) when post (30) is at the upper/distal position. Varying this distance will in turn vary the amount of pre-travel required for post (30) in order to activate proximity sensor (40). By way of example only, the positioning of proximity sensor (40) relative to housing (20) may be set such that post (30) must retract approximately 1 mm into housing (20) in order to trigger proximity sensor (40) (i.e., such that post (30) will not activate proximity sensor (40) for the first 1 mm of downward/proximal travel into housing (20)). As another merely illustrative example, the positioning of proximity sensor (40) relative to housing (20) may be set such that post (30) must retract approximately 7 mm into housing (20) in order to trigger proximity sensor (40) (i.e., such that post (30) will not activate proximity sensor (40) for the first 7 mm of downward/proximal travel into housing (20)). Other suitable degrees of sensitivity will be apparent to those of ordinary skill in the art in view of the teachings herein. Sensitivity adjustments may be based at least in part on manufacturing tolerances associated with objects that will engage sensor assembly (10) and/or based on other considerations.

Figure 11:
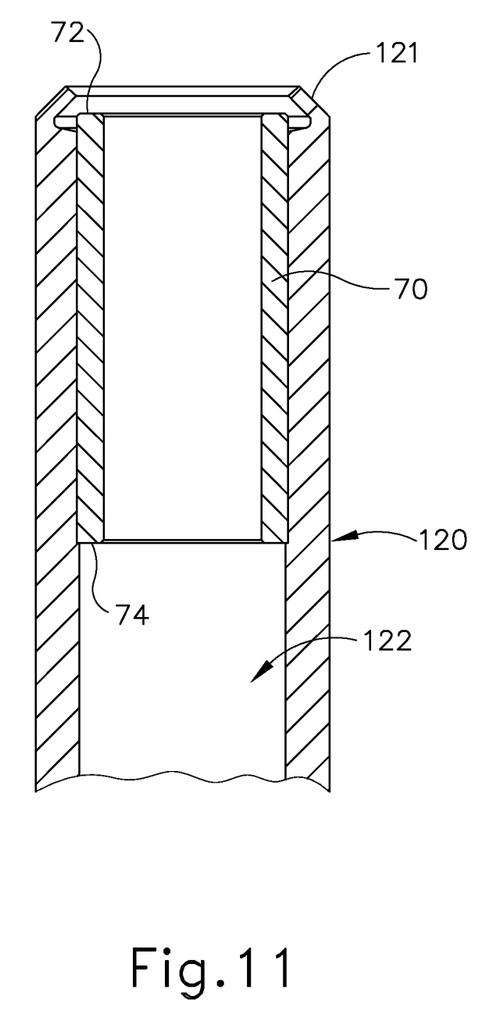
FIG. 11 shows a partial cross-sectional view of the distal end of an exemplary alternative housing, with a bushing disposed therein, and with a lip in a non-crimped configuration.
Figure 12:
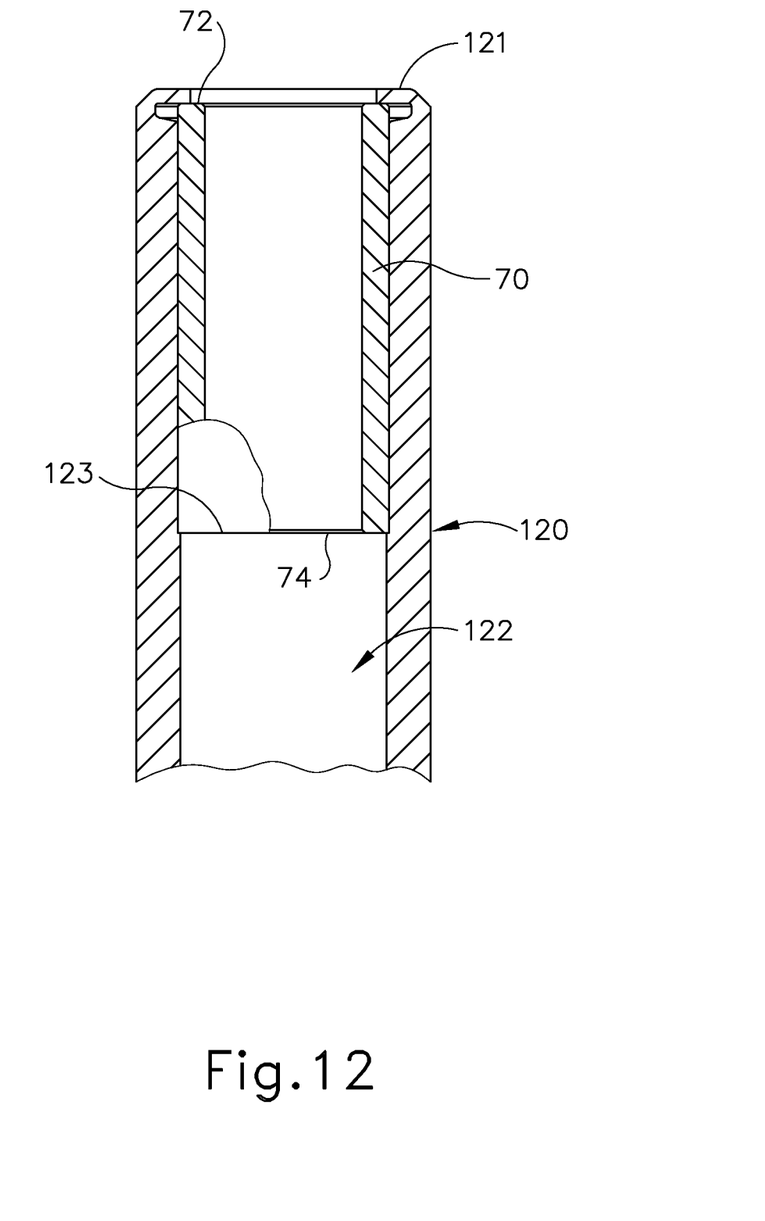
FIG. 12 shows a partial cross-sectional view of the distal end of the housing of FIG. 11, with the bushing disposed therein, and with the lip in a crimped configuration.

FIGS. 11-12 depict an exemplary alternative bushing configuration, in which a bushing (70) is captured within a bore (122) of an alternative housing (120). Housing (120) of this example is substantially similar to housing (20), except that housing (120) includes a foldable distal lip (121). As shown in FIG. 11, when distal lip (121) is in a non-crimped configuration, distal lip (121) defines an inner diameter that is larger than the outer diameter of bushing (70), such that bushing (70) may freely slide past lip (121) into bore (122). Bushing (70) is arrested by an interior shoulder (123) within bore (122), as best seen in FIG. 12, in which a portion of bushing (70) is omitted to show shoulder (123). The region of bore (122) that is distal to shoulder (123) defines an inner diameter that is greater than or equal to the outer diameter of bushing (70); while the region of bore (122) that is proximal to shoulder (123) defines an inner diameter that is less than the outer diameter of bushing (70). Shoulder (123) thus prevents further proximal movement of bushing (70) in bore (122) when the bottom edge (74) of bushing (70) engages shoulder (123). With bushing (70) seated on shoulder (123), lip (121) is crimped down to the position shown in FIG. 12, such that the crimped lip (121) contacts the upper edge (72) of bushing (70). The inner diameter of crimped lip (121) is less than the outer diameter of bushing (70), such that crimped lip (121) and shoulder (123) cooperate to secure bushing (70) within bore (122). Crimped lip (121) remains in the crimped position during normal use of sensor assembly (10). Still other suitable relationships between bushing (50, 58, 70) and housing (20, 120, 220) will be apparent to those of ordinary skill in the art in view of the teachings herein.

Other suitable components, features, configurations, and aspects for and of sensor assembly (10) will be apparent to those of ordinary skill in the art in view of the teachings herein.

Having shown and described various embodiments of the present invention, further adaptations of the methods and systems described herein may be accomplished by appropriate modifications by one of ordinary skill in the art without departing from the scope of the present invention. Several of such potential modifications have been mentioned, and others will be apparent to those skilled in the art. For instance, the examples, embodiments, geometrics, materials, dimensions, ratios, steps, and the like discussed above are illustrative and are not required. Accordingly, the scope of the present invention should be considered in terms of any claims that may be presented and is understood not to be limited to the details of structure and operation shown and described in the specification and drawings.

What is claimed is:
1. A sensor assembly, wherein the sensor assembly comprises:
 (a) a housing, wherein the housing presents a hollow interior;
 (b) a contact post, wherein a proximal portion of the contact post is slidably disposed within the interior of the housing, and wherein the proximal portion of the contact post presents a partial bore;

(c) a sensor, wherein the sensor is disposed within the hollow interior of the housing at a proximal end of the housing, and wherein the sensor is configured to be received within the partial bore of the contact post; and (d) a biasing member disposed within the hollow interior of the housing, wherein the biasing member is configured to exert a distally directed bias upon the contact post.

2. The sensor assembly of claim 1, wherein the contact post further comprises an annular shoulder, and wherein the annular shoulder is configured to restrict distal movement of the contact post relative to the hollow interior of the housing.

3. The sensor assembly of claim 1, wherein the biasing member.

4. The sensor assembly of claim 1, wherein the contact post comprises a rounded tip at a distal end of the contact post.

5. The sensor assembly of claim 1, wherein the contact post comprises a tip at a distal end of the contact post, wherein the tip has a bullnose configuration comprising a flat surface and a rounded edge.

6. The sensor assembly of claim 1, wherein the contact post comprises a conical tip at a distal end of the contact post.

7. The sensor assembly of claim 1, wherein the contact post comprises a flat tip at a distal end of the contact post.

8. The sensor assembly of claim 7, wherein the flat tip comprises a threaded bore disposed within the contact post.

9. The sensor assembly of claim 8, wherein the contact post further comprises a series of flat surfaces on an exterior of the contact post.

10. The sensor assembly of claim 1, wherein the sensor comprises a proximity sensor.

11. The sensor assembly of claim 1, wherein the sensor is configured to measure a distance from a distal tip of the sensor to a bottom of the partial bore of the contact post.

12. The sensor assembly of claim 11, wherein the sensor is operable to communicate the measurement to a data processor.

13. The sensor assembly of claim 1, wherein the sensor assembly further comprises a bushing, wherein the bushing is disposed within the hollow interior of the housing at a distal end of the housing, wherein the bushing presents a hollow interior, and wherein the bushing is configured to slidably receive the contact post within the hollow interior of the bushing.

14. The sensor assembly of claim 13, wherein the housing presents interior threading within the hollowing interior of the housing at the distal end of the housing, wherein the bushing presents exterior threading on an exterior surface of the bushing, and wherein the bushing is configured to be threaded into the housing.

15. The sensor assembly of claim 14, wherein the bushing further comprises a plurality of flat surfaces on the exterior surface of the bushing.

16. The sensor assembly of claim 13, wherein the housing comprises a lip at the distal end of the housing, and wherein the lip is configured to prevent the bushing from sliding distally out of the hollow interior of the housing.

17. The sensor assembly of claim 1, wherein the housing further comprises a weep hole, wherein the weep hole is configured to provide fluid communication between the hollow interior of the housing and the exterior of the housing.

18. The sensor assembly of claim 17, wherein the housing further comprises:

(a) an interior shoulder, wherein the interior shoulder is at a proximal end of the housing, and wherein a first opening of the weep hole is on the interior shoulder; and (b) an exterior recess, wherein the exterior recess is at the proximal end of the housing, wherein the exterior recess presents an exterior shoulder, and wherein a second opening of the weep hole is on the exterior shoulder.

19. A sensor assembly, wherein the sensor assembly comprises:

(a) a housing, wherein the housing comprises a hollow interior;

(b) a contact post, wherein a proximal portion of the contact post is slidably disposed within the interior of the housing, and wherein the proximal portion of the contact post comprises a partial bore;

(c) a proximity sensor, wherein the proximity sensor is disposed within the hollow interior of the housing at a proximal end of the housing, wherein the proximity sensor is configured to be received within the partial bore of the contact post, wherein the proximity sensor is responsive to movement of the contact post within the housing; and (d) a resilient member, wherein the resilient member is disposed within the hollow interior of the housing, and wherein the resilient member is configured to exert a distally directed bias upon the contact post.

20. A method of measuring a surface with a sensor assembly, wherein the sensor assembly comprises a housing, a contact post, and a sensor, wherein the contact post is slidably disposed within the housing, wherein sensor is responsive to movement of the contact post within the housing; the method comprising;

(a) contacting a point on a surface with a tip of the contact post, wherein the tip of the contact post is distal in relation to the housing, wherein the contact post moves proximally within the housing in response to the tip of the contact post contacting the point on the surface;

(b) sensing movement of the contact post within the housing; and (c) signaling to a data processor that movement has been sensed.

* * * * *